United States Patent
Ogawa et al.

[11] Patent Number: 5,804,879
[45] Date of Patent: Sep. 8, 1998

[54] ALUMINUM SCANDIUM ALLOY INTERCONNECTION

[75] Inventors: Shinichi Ogawa; Hiroshi Nishimura, both of Neyagawa; Tatsuya Yamada, Moriguchi, all of Japan

[73] Assignee: Matsushita Electric Industrial Co., Ltd., Kadoma, Japan

[21] Appl. No.: 653,116

[22] Filed: May 24, 1996

Related U.S. Application Data

[63] Continuation of Ser. No. 281,508, Jul. 27, 1994, abandoned, which is a continuation of Ser. No. 951,090, Sep. 25, 1992, abandoned.

[30] Foreign Application Priority Data

| Sep. 30, 1991 | [JP] | Japan | 3-280408 |
| Dec. 6, 1991 | [JP] | Japan | 3-322681 |
| Dec. 6, 1991 | [JP] | Japan | 3-322682 |
| Dec. 6, 1991 | [JP] | Japan | 3-322685 |

[51] Int. Cl.$^6$ .......................... H01L 23/48; H01L 23/52; H01L 25/40
[52] U.S. Cl. .......................... 257/765; 257/771
[58] Field of Search .................. 257/765, 771; 420/528, 534, 529, 537, 538, 544, 548

[56] References Cited

U.S. PATENT DOCUMENTS

| 3,619,181 | 11/1971 | Wilky | 470/538 |
| 4,017,890 | 4/1977 | Howard et al. | |
| 4,585,672 | 4/1986 | Schwarz et al. | 427/88 |
| 4,912,543 | 3/1990 | Neppl et al. | 257/771 |
| 5,036,382 | 7/1991 | Yamaha | 257/756 |
| 5,453,402 | 9/1995 | Cheung et al. | 437/195 |
| 5,541,007 | 7/1996 | Ueda et al. | 428/650 |

FOREIGN PATENT DOCUMENTS

| 55-31619 | 8/1980 | Japan . |
| 61-61257 | 12/1986 | Japan . |
| 1289140 | 11/1989 | Japan . |

OTHER PUBLICATIONS

Tohru Hara et al, "Stress in AL–SC Interconnection Layers" Jpn. J. Appl. Phys. vol. 32(1993) pp. 1394–1396.

Mayumi et al, IEEE/IRPS, 1987, pp. 15–21, "The Effect of Cu Addition to Al–Si Interconnects on Stress Induced Open–Circuits Failures".

*Primary Examiner*—Mahshid D. Saadat
*Assistant Examiner*—S. V. Clark
*Attorney, Agent, or Firm*—Renner, Otto, Boisselle & Sklar

[57] ABSTRACT

An aluminum interconnection of the invention contains scandium as an impurity, so that the hardness of the interconnection in improved. Moreover, after a thin Al-Sc alloy film is formed, an annealing is performed 80 as to make the crystal grain larger than the width of the interconnection. The resulting Al interconnection has a high resistance against a stressmigration or electromigration, when a current stress in applied at a practical temperature in an LSI. This greatly contributes to the fabrication of a semiconductor device having a fine structure.

32 Claims, 11 Drawing Sheets

PRESENT INVENTION

ALUMINUM SCANDIUM ALLOY INTERCONNECTION

This is a continuation of application Ser. No. 08/281,508 filed on Jul. 27, 1994, now abandoned which is a cont. of 07/951,090 filed on Sep. 25, 1992, now abandoned.

BACKGROUND OF THE INVENTION

1. Field of the Invention

The present invention relates to a material for an aluminum (Al) interconnection used in a semiconductor device with high integration and high reliability, and a method of fabricating the Al interconnection.

2. Description of the Prior Art

As semiconductor devices are highly integrated, what is called an electromigration or a stressmigration becomes a significant problem in reliability of an Al interconnection. An interconnection made of Al-X alloy (X; an added impurity) containing Al as the main alloying ingredient is herein referred to as an Al interconnection. Usually, as a material for the Al interconnection, an Al alloy containing Si is used, and the Al interconnection is deposited by sputtering. A conventional method of fabricating an Al interconnection in a semiconductor device is described below. An shown in FIG. 2, generally, an insulating film 2 is formed over a silicon substrate 1 on which semiconductor devices are formed. A contact hole 3 in selectively formed in the insulating film 2. A first Al interconnection layer 10 is formed on the insulating film 2 and in the contact hole 3. Then, an interlayer insulating film 5 in deposited and planarized. A via hole 6 is formed in the interlayer insulating film 5 and a second interconnection layer 11 in formed. Thereafter, a passivation film 9 is formed thereon. The first and second Al interconnection layers 10 and 11 are made of Al-Si-Cu.

As the semiconductor devices are highly integrated, a fine Al interconnection is required. This fine Al interconnection causes a disconnection due to a stressmigration induced by the tensile stress of an interlayer insulating film and a passivation film around the Al interconnection, or due to an electromigration induced by a current and the tensile stress. The disconnection occurs, when the Al interconnection in annealed in a later process, and when the assembled semiconductor chip actually operates.

As a method for solving the above problem, there is a method in which copper (Cu) is added as an impurity, so that the reliability of the Al interconnection, especially the stressmigration resistance in enhanced (see, for example, 25th Ann. Pro. IEEE Int. Reliability Phys. Symp., 1987, pp. 15–21). In an Al interconnection containing about 0.1%Cu, a grain boundary diffusion of atom vacancy or a vacancy diffusion through a grain is suppressed even when a stress or a current is applied. Therefore, a so-called void formation in the fine interconnection can be suppressed, and any probability of failure caused by a stressmigration or an electromigration can be reduced. However, an Al interconnection containing Cu is not reliable, because the width of the interconnection is of a submicrometer order. At a high temperature in the range of 400° C. to 500° C. after an Al interconnection is formed, for example, in a blanket tungsten, which is used as an underlying layer of the Al interconnection, deposition process by chemical vapor deposition (CVD) and in an interlayer insulating film deposition process, voids occurs in the Al interconnection, which results in a disconnection. When an assembled semiconductor chip operates at a low temperature, in the range of 50° C. to 150° C., an Al interconnection disconnection failure occurs. Furthermore, the Al interconnection containing Cu has another problem in that a disconnection failure is likely to occur by corrosion.

Another method in which an Al interconnection including a region of an intermetallic compound of Al and a transition metal is formed is proposed (for example, in Japanese Patent Publication No. 55-31619). There are two kinds of Al interconnection structures. As shown in FIG. 19, a first Al interconnection structure is formed on an insulating layer 37 covering a substrate 36. In the first Al interconnection structure, an intermetallic compound layer 39 of a transition metal and Al in Al layers 38 and 40 is formed as an intermediate layer. In the second Al interconnection structure, an intermetallic compound layer is formed by adhering Al and a transition metal at the same time. By using such a method, tho movement or diffusion of Al or vacancies occurring during a current application is reduced, so that an interconnection with a high electromigration resistance can be formed.

The above-mentioned first Al interconnection structure in which an intermetallic compound of Al and a transition metal is formed in the shape of a layer in the interconnection has the following problem. As shown in FIG. 20A, when voids 41 and 42 are formed by an electromigration in the Al layers 36 and 40 which are respectively positioned under and on the intermetallic compound layer 39, an electrical connection of the interconnection structure is maintained through the intermetallic compound layer 39. However, since all the currents flowing through the interconnection concentrate in the intermetallic compound layer 39 of high resistance, the temperature of the interconnection structure rises due to self-heating. This makes the voids 41 and 42 larger. Therefore, the interconnection resistance is disadvantageously increased as the time elapses.

In the second Al interconnection structure in which the intermetallic compound is formed by adhering Al and a transition metal at the some time, the life time of electromigration is shortened as compared with the first structure, which is disclosed in the above-identified Japanese Patent Publication. The Patent Publication does not describe any interconnection of Al containing scandium (Sc) as an impurity.

SUMMARY OF THE INVENTION

The aluminum interconnection of this invention contains scandium as an impurity.

In a preferred embodiment, the scandium may be substantially uniformly distributed.

In a preferred embodiment, part of the scandium may be distributed as a precipitate.

In a preferred embodiment, a lattice constant of maid precipitate may be in the range of 100% to 103% with respect to the lattice constant of aluminum.

In a preferred embodiment, the amount of the scandium may be in the range of 0.01 wt. % to 0.5 wt. %.

Alternatively, the interconnection of the invention comprises an aluminum layer and a conductive layer formed on at least one of the upper and lower sides of said aluminum layer, wherein the aluminum layer contains scandium as an impurity.

In a preferred embodiment, the conductive layer may be made of a refractory metal material.

In another aspect of the invention, the semiconductor device comprises: a semiconductor substrate; an insulating film formed on the semiconductor substrate; an opening formed in the insulating film; and an interconnection formed on the insulating film, the interconnection being in contact with the semiconductor substrate via the opening, wherein the interconnection includes an aluminum layer containing scandium as an impurity.

In a preferred embodiment, the interconnection may further include a conductive layer at least between the aluminum layer and the semiconductor substrate.

Alternatively, the semiconductor device comprises: a first interconnection; an interlayer insulating film which covers the first interconnection; an opening formed in the interlayer insulating film; and a second interconnection formed on the interlayer insulating film, the second interconnection being in contact with the first interconnection via the opening, wherein the second interconnection includes an aluminum layer containing scandium as an impurity.

In a preferred embodiment, the second interconnection may further include a conductive layer at least between the aluminum and the first interconnection.

In still another aspect of the invention, the interconnection comprises an aluminum layer and a conductive layer formed on at least one of the upper and lower sides of the aluminum layer, wherein the conductive layer contains scandium.

In a preferred embodiment, the conductive layer is made of scandium.

In still another aspect of the invention, the method of fabricating an interconnection comprises the steps of: depositing an aluminum layer containing scandium as an impurity on a substrate by a sputtering method using an alloy target containing aluminum and at least scandium; annealing the aluminum layer; and forming an interconnection by removing part of the aluminum layer.

In a preferred embodiment, the step of annealing may be performed at 350° C. or a higher temperature.

In a preferred embodiment, the steps of depositing and annealing may be simultaneously performed.

Alternatively, the method of fabricating an interconnection comprises the steps of: forming a multi-layer film including an aluminum layer and a refractory material layer by sputtering, the aluminum layer containing scandium as an impurity, the refractory material layer being formed on at least one of the upper and lower sides of the aluminum layer; annealing the multi-layer film; and forming an interconnection by removing part of the multi-layer film.

In a preferred embodiment, the step of annealing may be performed at 350° C. or a higher temperature.

In still another aspect of the invention, the method of fabricating a semiconductor device comprises the steps of: forming an insulating film on a semiconductor substrate; forming an opening in the insulating film; and forming an aluminum layer containing scandium as an impurity on the insulating film, the aluminum layer being in contact with the semiconductor substrate via the opening.

In a preferred embodiment, the method may further comprise a step of forming a conductive layer at least in said opening, prior to the step of forming the aluminum layer.

Alternatively, the method of fabricating a semiconductor device comprises the steps of: forming a first interconnection; forming an Interlayer insulating film which covers the first interconnection; forming an opening in the interlayer insulating film; and forming a second interconnection including an aluminum layer which contains scandium as an impurity on the interlayer insulating film, the second interconnection being in contact with the first interconnection via the opening.

In a preferred embodiment, the method may further comprise a step of forming a conductive layer at least in said opening before the aluminum layer is formed.

In still another aspect of the invention, the method of fabricating an interconnection comprises the steps of: forming a multi-layer film including an aluminum layer and a scandium layer on a substrate by sputtering, the scandium layer being formed on at least one of the upper and lower sides of the aluminum layer; annealing the multi-layer film; and forming an interconnection by removing part of the multi-layer film.

In a preferred embodiment, the step of annealing may be performed at 350° C. or a higher temperature.

According to the invention, the interconnection is made of Al containing Sc as an impurity. In the Al interconnection of the invention, the Sc is substantially uniformly distributed. In the Al interconnection of the invention, part of the Sc in distributed an a compound with aluminum.

With the above-mentioned configuration, Sc in contained in Al and substantially uniformly distributed, so that the Al interconnection is strengthened due to age hardening. Therefore, any occurrence of dislocation is suppressed and the stressmigration resistance remains high.

A compound of Sc and Al is formed in an aluminum crystal grain, so that vacancies are prevented from moving in the crystal grain and any occurrence of voids is suppressed. Therefore, the increase or interconnection resistance due to the occurrence of voids can be suppressed. Moreover, disconnection failures due to corrosion have difficulty in occurring.

As a result, according to the invention, an Al interconnection with high reliability in which disconnection failures are not caused even in a high temperature annealing after the formation of the interconnection, and in a low temperature mode of a semiconductor chip in which a practical current or a temperature stress is applied is provided.

Thus, the invention described herein makes possible the advantages of (1) providing a practical Al interconnection suitable for a large scale integrated circuit (LSI) which can prevent disconnection caused by a stressmigration or an electromigration in a multilevel interconnection scheme, (2) providing a semiconductor device having a reliable Al interconnection, and (3) providing a method of fabricating the Al interconnection and the semiconductor device.

These and other advantages of the present invention will become apparent to those skilled in the art upon reading and understanding the following detailed description with reference to the accompanying figures.

DESCRIPTION OF THE PREFERRED EMBODIMENTS

EXAMPLE 1

Figure 1:
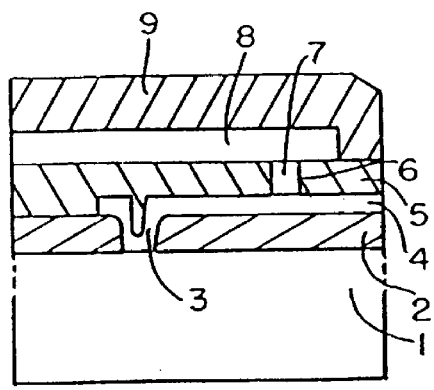
FIG. 1 in a sectional and schematic view showing an Al interconnection structure in a semiconductor device in a first example of the invention.
Figure 2:
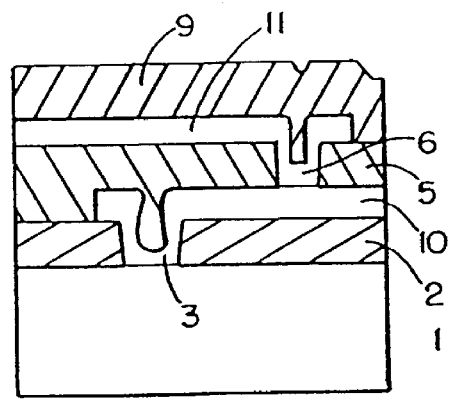
FIG. 2 is a sectional and schematic view showing an Al interconnection structure in a semiconductor device of a prior art.

FIG. 1 shows a sectional and schematic view showing an Al interconnection structure in a semiconductor device in a first example of the invention. A contact hole 3 is selectively formed in an insulating film 2 on a silicon substrate 1. A first Al interconnection 4 of an Al-0.15%Sc alloy is formed to a thickness of 400 nm and comes in contact with the silicon substrate 1 via the contact hole 3. The first Al interconnection 4 is connected to a second Al interconnection 8 of an Al-Sc alloy having a thickness of 800 nm via a tungsten plug 7. The tungsten plug 7 is buried in a via hole 6 formed in an interlayer insulating film 5. The layers structure is covered with a passivation film 9 such as a silicon nitride film or a silicon oxide film.

One of the features of the invention resides in that Al which is a major alloying ingredient of the Al interconnections 4 and 8 contains Sc as an impurity in the interconnection structure. The content of Sc in Al interconnections 4 and 8 is preferably in the range between 0.01 wt. % and 0.5 wt. %. The reason why the lower limit of the content of Sc is set to be 0.01 wt. % is that, if Al contains another kind of element of about 0.01 wt. %, the characteristics of Al are significantly changed. The reason why the upper limit of the content of Sc is sat to be 0.5 wt. % in that, if Sc in added to 0.5 wt. % or more, a compound of Al and Sc is excessively educed in the interconnection. This causes an undesirable unetched portion after dry etching for forming an Al interconnection, so that a shorting failure between interconnections or that the interconnection resistance is increased. The solid solubility of Sc into Al is low as compared with the case of Cu. For example, the solid solubility is 0.025% at a temperature of 400° C., 0.045% at 450° C., 0.08% at 500° C., 0.16% at 550° C., and 0.6% at 655° C. In view of this, in a case of Sc, it is possible to attain a sufficient effect at a small content as compared with the content of 0.5–4% Cu which is usually used.

Figure 3A:
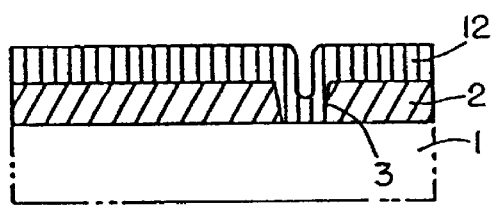
FIG. 3A to 3C are sectional views illustrating a fabrication process of an Al interconnection in a semiconductor device in the first example of the invention.
Figure 3C:
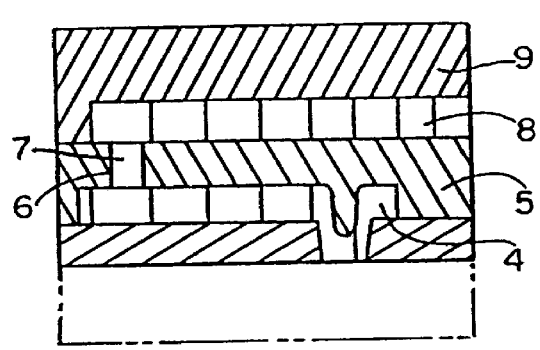
Figure 3B:
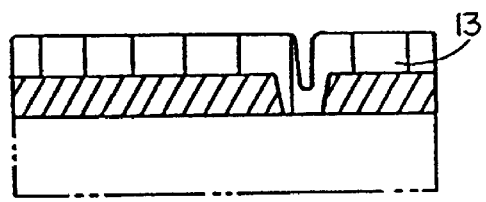

FIGS. 3A to 3C are sectional views showing a fabrication procedure of an Al interconnection in a semiconductor device in the first example. In FIG. 3A, the insulating film 2 is deposited over the silicon substrate 1 on which semiconductor transistors are formed. After a contact hole 3 is selectively formed in the insulating film 3, a thin Al-0.15%Sc alloy film 12 is deposited to a thickness of 400 nm by sputtering. Then, in FIG. 3D, an annealing is performed at a temperature of 350° C. to 600° C., so as to form a thin Al-0.15%Sc alloy film 13 with large grain diameter. Thereafter, in FIG. 3C, the first Al interconnection 4 of the Al-0.15%Sc alloy is formed by photoetching. The interlayer insulating film 5 is formed and a via hole 6 is formed by photoetching. The tungsten plug 7 is buried in the via hole 6. Then, a thin Al-0.15%Sc alloy film having a thickness of 800 nm is deposited by sputtering, and an annealing is performed at a temperature of 350° C. to 600° C. Thereafter, the second Al interconnection 8 of the Al-0.15%Sc alloy in formed by photoetching. Moreover, the layered structure is covered with the passivation film 9 such as a silicon nitride film or a silicon oxide film.

Figure 4:
FIG. 4 is a plan TEM photograph showing the grain structure of a thin Al-Sc film after annealing at 430° C. in the first example.

In this example, the annealing at a temperature of 350° C. to 600° C. is performed after the Al-Sc alloy is deposited. The purpose of the annealing is to make the crystal grain diameter of the Al-Sc alloy is which is deposited by sputtering larger, which is briefly described above. Usually, the crystal grain diameter of the thin Al-Sc alloy film in, for example, about 100 nm to 300 nm directly after the deposition, if the film thickness is 800 nm. By performing an annealing for 30 minutes at 450° C., the crystal grain grows to have a diameter of about 1 μm to 2 μm. As an example, FIG. 4 shows a plan transmission electron microscope (TEM) photograph showing the thin Al-SC alloy film after the annealing at 430° C. By this growth of crystal grain, the structure of the Al-Sc alloy interconnections 4 and 8 is made to be a bamboo structure, so that the electromigration resistance of the Al interconnection having a width of 1 μm or smaller can be improved. Now, in the case of a thin Al-Si-Cu film which is used for mass production, a photo-etching process is performed without an annealing. In this case, the crystal grain diameter in about 1 μm to 3 μm after the thin Al-Si-Cu film in formed. Therefore, the thin Al-Sc film which is annealed can be easily etched under conventional dry etching conditions.

Figure 5:
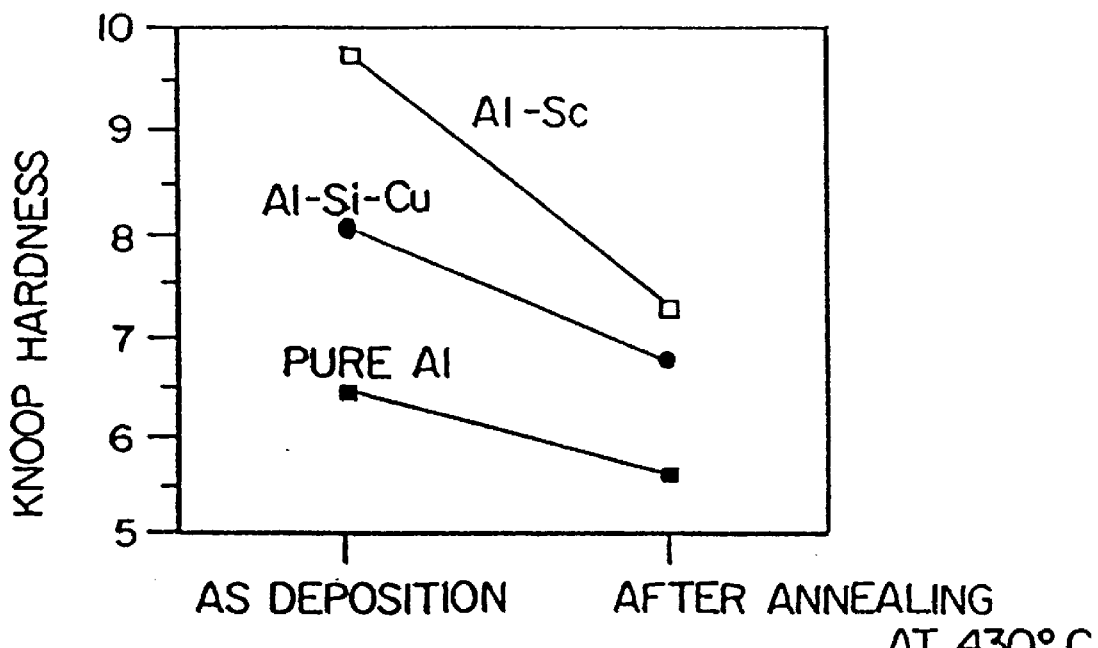
FIG. 5 shows variations in Knoop hardnesses of an Al-0.15%Sc alloy used in the first example of the invention, an Al-1%Si-0.5%Cu alloy which is conventionally used, and pure Al, respectively, after annealing at 430° C.
Figure 6:
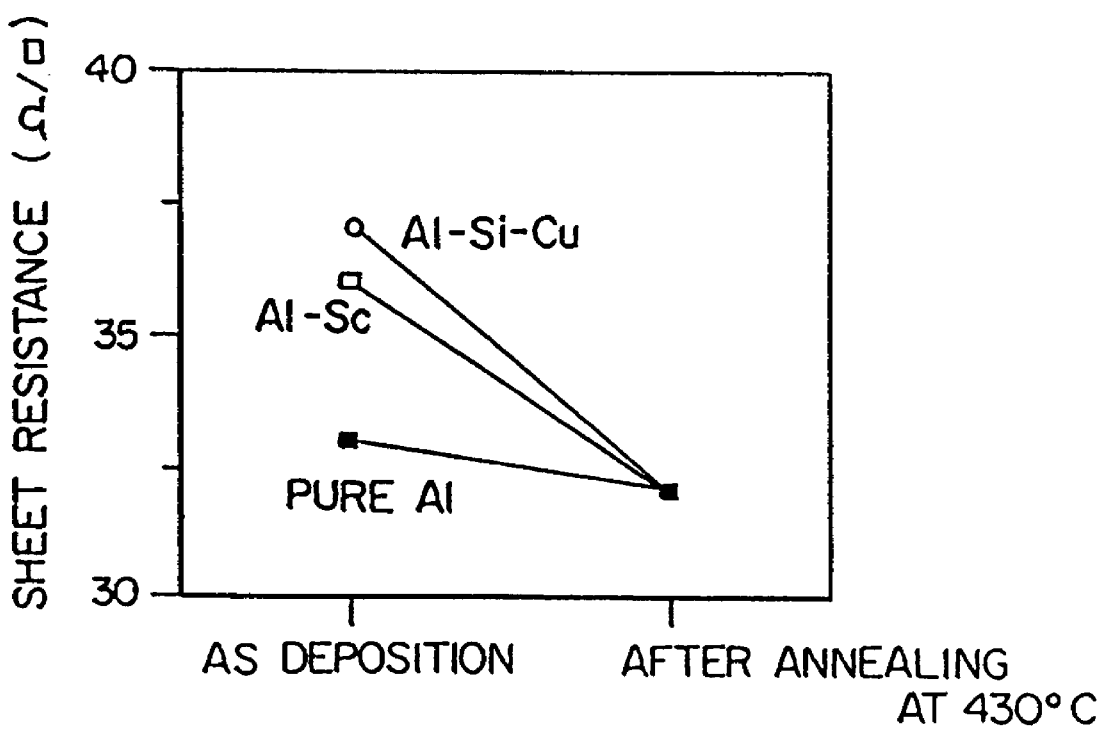
FIG. 6 shows variations in electrical sheet resistances of an Al-0.15%Sc alloy used in the first example of the invention, an Al-1%Si-0.5%Cu alloy which is conventionally used, and pure Al, respectively, after annealing at 430° C.

FIG. 5 shows Knoop hardnesses of Al-0.15%Sc, Al-1%Si-0.5%Cu, and pure Al, respectively, directly after deposition by the same sputtering deposition apparatus to have a thickness of 800 nm, and after an annealing at 430° C. FIG. 6 shown a variation in sheet resistance. The Al-Sc alloy annealed has the same sheet resistance, i.e., the same interconnection electrical resistance as that of the pure Al. Moreover, the Al-Sc alloy is harder then the Al-Si-Cu alloy and the pure Al, so that the Al-Sc alloy in more suitable as a material for Al interconnection used in the LSI than the Al-Si-Cu alloy and the pure Al.

Figure 7A:
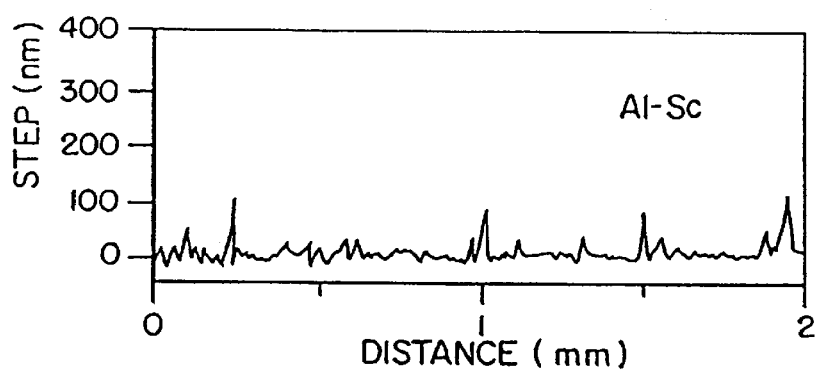
FIGS. 7A and 7D show surface roughness of the thin Al-0.15%Sc alloy film in the first example of the invention, the thin Al-1%Si-0.5%Cu alloy film of a prior art, and the pure Al film each having a thickness of 800 nm and after annealing at 430° C.
Figure 7B:
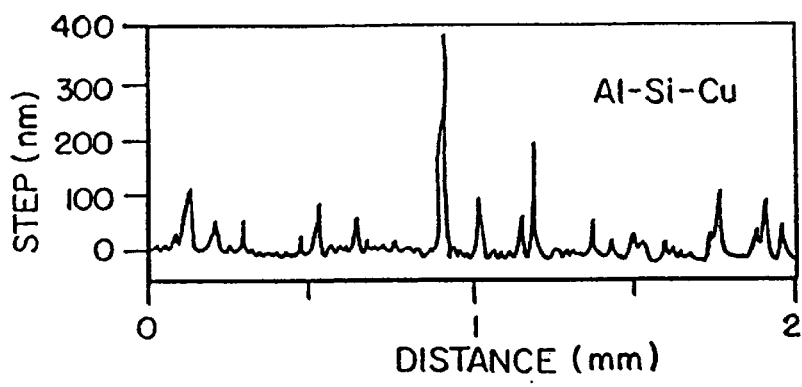

FIGS. 7A end 7B show surface roughnesses of the thin Al-0.15%Sc alloy film (the invention), and the thin Al-1%Si-0.5Cu alloy film (prior art), each having a thickness of 800 nm and after annealed at 430° C., measured by alpha steps. The surface roughness profile shows a so-called hillock. In the thin Al-1%Si-0.5%Cu alloy film, the number of hillocks is large and the height thereof is also large. For example, the highest hillock is 400 nm high. On the contrary, in the thin Al-0.15%Sc alloy film, the number is small and the height is 100 nm or smaller. Therefore, in the multilevel Al interconnection scheme using thin Al-Sc alloy films, a failure caused by a breakage of insulating film by a hillock of the first level Al interconnection and the second level Al interconnection which sandwich the interlayer insulating film can be prevented.

Figure 8:
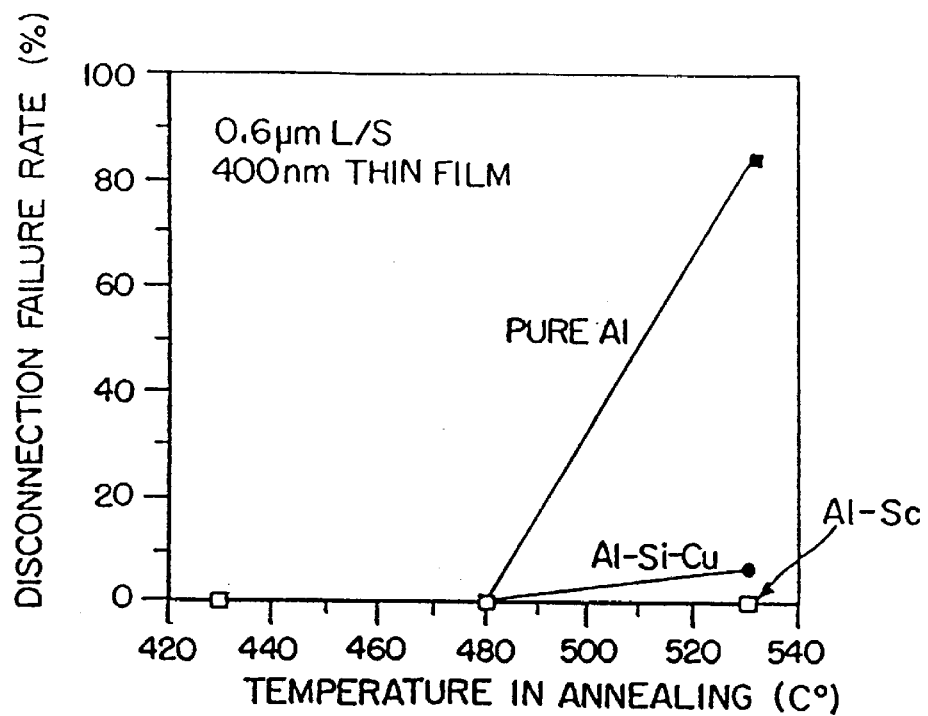
FIG. 8 shows high temperature mode disconnection failure rates of fine interconnections having line and space of 0.6 μm and a thickness of 400 nm of Al-Sc alloy in the first example of the invention after annealing at 530° C.
Figure 9A:
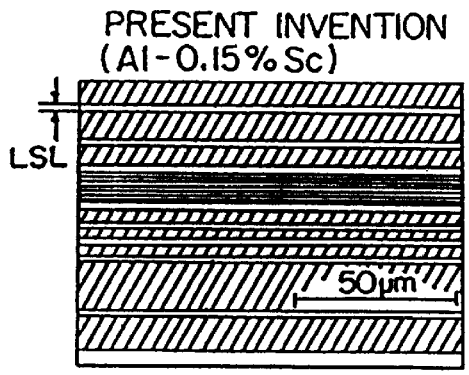
FIGS. 9A and 9D show a variation in interconnection shape in a wide interconnection portion (thickness; 400 nm) in a case of an Al-0.15%Sc alloy in the first example of the invention and in a case of an Al-1%Si-0.5%Cu alloy in the prior art after the annealing at 530° C.
Figure 9B:
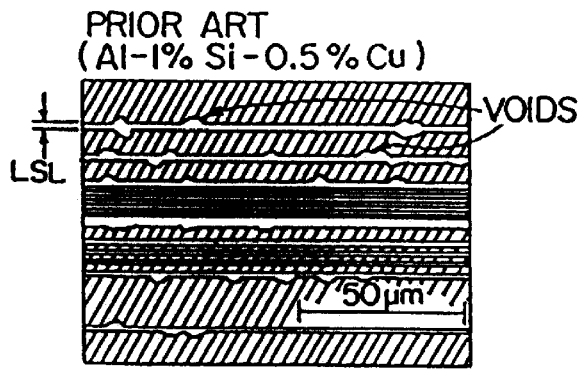

Next, the Al interconnection in a high temperature mode after an annealing at 530° C. is described. FIG. 8 shows disconnection failure rates of fine interconnections having line and space of 0.6 μm and a thickness of 400 nm of the invention and the prior art. In the cases of the pure Al and the Al-Si-Cu as conventional interconnection materials, the failure rates are respectively at 82.5% and 6.8%. On the contrary, in the case of the thin Al-0.15%Sc alloy interconnection of the invention, the failure rate is at 0%. Each of FIGS. 9A and 9B show a variation in interconnection shape in a wide interconnection portion. In the case of the Al-Si-Cu interconnection, a broken, i.e., a void having a size of about several micrometers to ten micrometers appears at an interconnection edge portion. On the contrary, in the Al-Sc interconnection in this example, no void appears.

In the case where the second structure of the prior art is used, for example when Al and cobalt (Co) an a transition metal are deposited at the same time, an intermetallic compound is formed. However, in this structure, the movement of Al in the grain boundary is only prevented, but the formation of voids is not so prevented, which is described in Japanese Patent Publication No. 55-3119. On the contrary, according to the invention as shown in FIG. 20D, it in ascertained by experiment that the compounds 44 of Al and Sc are substantially uniformly distributed within an Al crystal grain, i.e., a region surrounded by crystal grain boundaries 52. The age hardening based on the compounds 44 strengthens the Al interconnections, so that the occurrence of dislocation can be suppressed and the Al interconnection has a high stressmigration resistance. Moreover, the lattice constant of the compound 44 mismatches that of the Al layer 43, so that a strain occurs. Vacancies 45 are trapped by this strain, so that the vacancies are prevented from moving in the crystal grains, and the formation of voids can be suppressed. Accordingly, the increase in interconnection resistance due to the voids can be suppressed. Therefore, according to the present invention, an Al interconnection which has a high stressmigration resistance can be formed an compared with the second structure of the prior art.

Figure 21A:
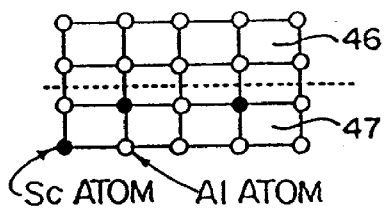
FIGS. 21A and 21B are schematic views showing crystal structures, at an interface of Al and a compound of Al and Sc.
Figure 21B:
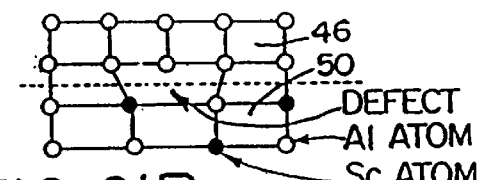

When a compound of Al and Sc is formed in the Al interconnection, the lattice constant varies depending on the composition ratio of the compound, so that the reliability of the interconnection is also varied. If the lattice constant of a compound is substantially the same an that of Al, good crystals having little strain can be formed, and moreover tho vacancies 45 are easily trapped. If the lattice constant of a compound is largely different from that of the Al, for example, if they mismatch 103% or more, the ability of trapping the vacancies 45 is enhanced. Au the degree of mismatch becomes high, however, a lot of crystal defects occur, which is considered to seriously affect the reliability of the interconnection. For example, as shown in FIG. 21A, $Al_3Sc$ 47 is formed as a compound, the lattice constant of $Al_3SO$ 47 is 4.10 Å which is 101.2% with respect to the lattice constant of the Al lattice 46 of 4.05 Å. Therefore, good crystals having little strain can be formed, and an interconnection having a high electromigration or stressmigration resistance can be formed. On the contrary, if the adding amount of Sc to Al is increased, $Al_2Sc$ 50 and/or Sc other then the $Al_3Sc$ 47 is likely to appear as a compound, as shown in FIG. 21B. The lattice constant of the $Al_2Sc$ 50 is 7.58 Å which is 187% with respect to the lattice constant of the Al lattice 46 of 4.05 Å. Therefore, the lattice mismatch becomes high and a large number of crystal defects occur. As a result, a failure caused by an electromigration or a stressmigration is likely to occur.

Figure 10:
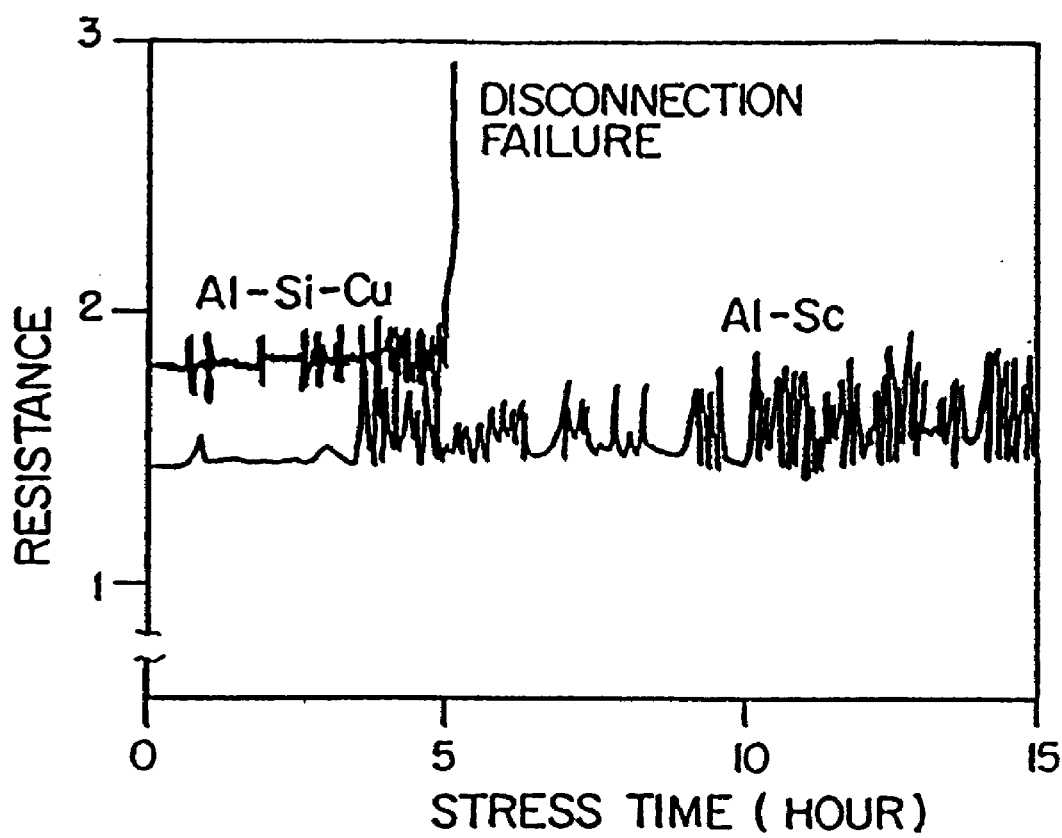
FIG. 10 shown electromigration characteristics of an Al-Sc alloy interconnection with a width of 1.2 μm in the first example of the invention and a conventional Al-Si-Cu alloy interconnection.
Figure 20A:
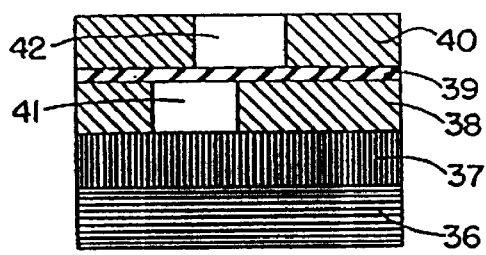
FIGS. 20A and 20B are sectional and schematic views showing Al interconnection structures of a prior art, and the invention.
Figure 20B:
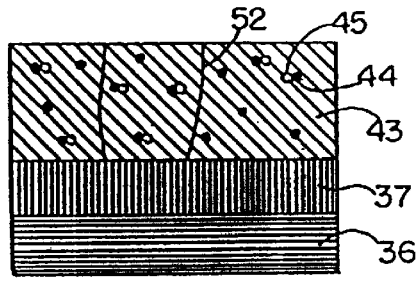

FIG. 10 shows electromigration characteristics which are tested at a wafer level. The temperature of the substrate is set at 200° C., the width of Al interconnection is 1.2 μm, and the current density in $4.2 \times 10^6$ A/cm$^2$. In the case of the Al-Si-Cu wiring, a disconnection failure occurs after about 5 hours elapse. In the case of the Al-0.25%Sc interconnection of the invention, a disconnection failure does not occur even after 15 hours elapse. The first Al interconnection structure of the prior art in which an intermetallic compound of Al and a transition metal is formed in the shape of a layer in the interconnection has a following problem. In the case where voids 41 and 42 are caused by an electromigration in the Al layers 30 and 40 which are respectively positioned under and on the intermetallic compound layer 39, a continuity of interconnection is maintained by the intermetallic compound layer 39. However, since all the currents flowing through the interconnection concentrate in the intermetallic compound layer 39 of high resistance, the temperature of the interconnection rises due to the self-heating. This makes the voids 41 and 42 larger. Therefore, the interconnection resistance is disadvantageously increased as the time elapses (FIG. 20A). In the second Al interconnection structure of the prior art in which the intermetallic compound is formed by adhering Al and a transition metal at the same time, the life time of electromigration is shortened as compared with the first structure. On the other hand, in the present invention, a compound 44 of Al and Sc is formed by substantially uniformly distributing Sc in the crystal grains of Al interconnection, so that the movement of Al and vacancies 45 in the crystal grains can be suppressed (FIG. 20B). Moreover, a failure caused by an electromigration due to the increase in resistance as appears in the first structure of the prior art can be suppressed.

In this example, a two-level interconnection process including the first and second Al interconnections is described. However, it is understood that the invention can be applied to a multi-level interconnection process including three or more level interconnections. If the thickness of Al-Sc alloy interconnection layer is in the range used in a usual LSI (e.g., in the range of 100 nm to 1500 nm), the interconnection characteristics including an etching characteristic attained by the invention are not deteriorated at all. Moreover, in a recent LSI, in order to enhance the above-mentioned electromigration or stressmigration resistance, a layered interconnection structure in which a refractory material such an Ti or TiW and an Al material are layered is used. It the layered interconnection structure is used in this invention, higher reliability can be realized as compared with the prior art layered Al interconnection structure.

As described above, an Al interconnection containing Sc as an impurity is formed by a method in which a thin Al-Sc alloy film is deposited and then annealed, whereby the Al interconnection with high reliability which has high resistance against a stressmigration or an electromigration can be realized.

EXAMPLE 2

Figure 11:
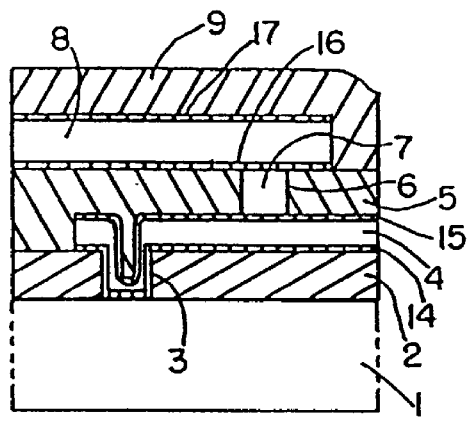
FIG. 11 in a sectional and schematic view showing an Al interconnection structure in a semiconductor device in a second example of the invention.

FIG. 11 in a sectional and schematic view of an Al interconnection structure in a semiconductor device in a second example of the invention. A contact hole 3 is selectively formed in an insulating film 2 on a silicon substrate 1. A thin Ti film 14 as a refractory and conductive thin film is deposited to a thickness of 75 nm through the contact hole 3. A first Al-0.15%Sc alloy interconnection 4 is successively deposited to a thickness of 400 nm on the thin Ti film 14. Another thin Ti film 15 is then deposited to a thickness of 20 nm on the first Al-0.15%Sc alloy interconnection 4. A layered first Al interconnection includes the thin Ti film 14, the first Al-0.15%Sc alloy interconnection 4, and the thin Ti film 15, and is coupled to the silicon substrate 1. A via hole 6 is formed in an interlayer insulating film 5. The layered first Al interconnection is connected to a layered second Al interconnection including a thin Ti film 16 having a thickness of 75 nm, a second Al-Sc alloy interconnection 8 having a thickness of 600 nm and a thin Ti film 17 having a thickness of 20 nm, through a tungsten plug 7 buried in the via hole 6. The structure is covered with a passivation film 9 such as a silicon nitride film or a silicon oxide film.

One of the features of the invention resides in that Al as a major alloying ingredient of the first and second Al alloy interconnections 4 and 8 in this interconnection structure contains 0.01–0.5% Sc as an impurity, and that refractory and conductive layers are formed as upper and lower layers.

Figure 12C:
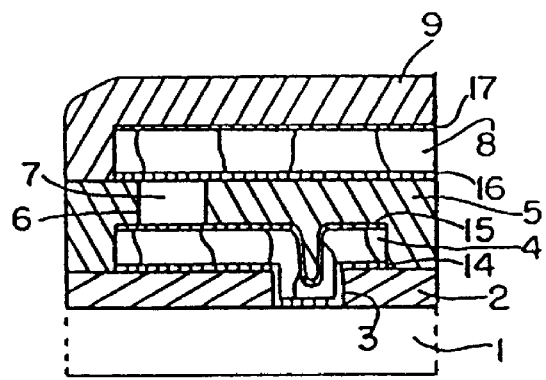
FIG. 12A to 12C are sectional views showing a fabrication process of an Al interconnection in a semiconductor device in the second example of the invention.
Figure 12A:
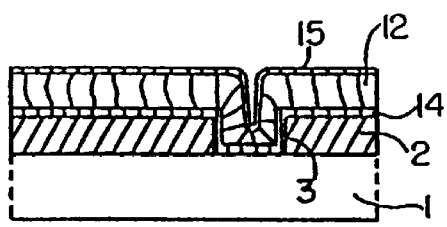
Figure 12B:
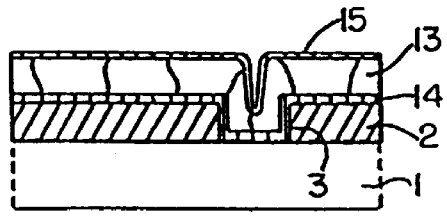

FIGS. 12A to 12C show sectional views showing a fabrication process of the Al interconnection of the second example of the invention.

As shown in FIG. 12A, the insulating film 2 is deposited over the silicon substrate 1 on which semiconductor transistors are formed. The contact hole 3 is selectively formed in the insulating film 2. Then, the thin Ti film 14 having a thickness of 75 nm, a thin Al-0.15%Sc alloy film 12 having a thickness of 400 nm, and the thin Ti film 15 having a thickness of 20 nm are deposited by sputtering.

As shown in FIG. 12B, an annealing is performed at 350° C. to 600° C., so that a thin Al-0.15%Sc alloy film 13 with large grains is formed from the thin Al-0.15%Sc alloy film 12. Then, the first Al-0.15%Sc alloy interconnection 4 is formed by photoetching.

As shown in FIG. 12C, the interlayer insulating film 5 is formed, and the via hole 6 is formed by photoetching. The tungsten plug 7 is burled in the via hole 6. The thin Ti film 16 having a thickness of 75 nm, a thin Al-0.15%Sc alloy film having a thickness of 800 nm, and the thin Ti film 17 having a thickness of 20 nm are deposited by sputtering. An annealing is performed at 350° C. to 600° C., so that a thin Al-0.15%Sc alloy film with large grains is formed as in the layered first Al interconnection. Thereafter, the second Al-0.15%Sc alloy interconnection 8 is formed by photoetching. Moreover, the structure in covered with the passivation film 9 such as a silicon nitride film or a silicon oxide film.

In this example, the annealing at 350° C. to 600° C. is performed after the Al-Sc alloy is deposited. The purpose of the annealing is to make the crystal grain of Al-Sc alloy larger. Usually, the crystal grain diameter of the thin Al-Sc alloy film is, for example, about 100 nm to 300 nm directly after the deposition, if the film thickness is 800 nm. By performing the annealing for 30 minutes at 450° C., the crystal grain grows to have a diameter of about 1 $\mu$m to 2 $\mu$m. As an example, FIG. 4 shown a plan TEM photograph showing the thin Al-Sc film after the annealing at 430° C. By this growth of crystal grain, the structure of the first and second Al-Sc alloy interconnections 4 and 8 is made to be a bamboo structure, so that the electromigration resistance of Al interconnection having a width of 1 $\mu$m or smaller can be enhanced. Now, in the case of a thin Al-Si-Cu film which is used for mass production, a photoetching process is performed without an annealing. In this case, the crystal grain diameter is about 1 $\mu$m to 3 $\mu$m after the thin Al-Si-Cu film is formed. Therefore, the thin Al-Sc film which is annealed can be easily etched under conventional dry etching conditions.

As described above, in this example, an Al-Sc alloy is used as an Al interconnection material, so that the hardness of the interconnection in increased. The interconnection has a layered structure with thin refractory and conductive films (e.g., Ti), and a thin Al-Sc alloy film is formed. Thereafter, an annealing is performed so as to make the crystal grain larger then the width of the interconnection. An a result, the Al interconnection can have a higher resistance against a stressmigration or electromigration as compared with a case of a single thin Al-Sc alloy film, when a current stress is applied at a temperature practically in an LSI. By applying a thin refractory and conductive film under the Al-Sc alloy film, the surface morphology of the Al-Sc alloy film is further improved, which contributes to a fabrication of a semiconductor device having a fine structure.

In the above example, Ti is used. However, it is understood that, if the thin refractory and conductive film is made of another material such as Ta, Mo, WSi, TiW, Cr, TiN, the same effects can be attained. Moreover, in this example, the thicknesses of the lower and the upper thin Ti films are 75 nm and 20 nm, respectively, but a Ti film of a thickness of 5 nm to 200 nm can attain the same effects.

In this example, an Al interconnection having a layered structure including refractory and conductive thin films on and under the thin Al-Sc film. However, if an Al interconnection has a layered structure including a thin refractory and conductive film on or under the thin Al-Sc film, the Al interconnection can have a further high resistance against a stressmigration or electromigration.

EXAMPLE 3

Figure 13:
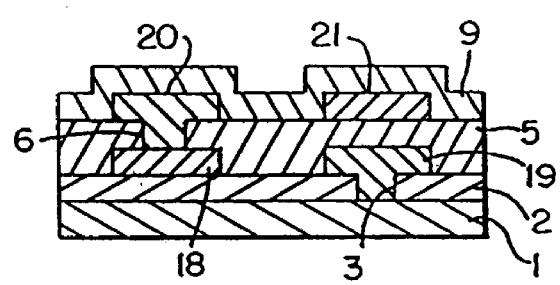
FIG. 13 in a sectional view showing a multi-level interconnection structure in a third example of the invention.

FIG. 13 in a sectional view snowing a multi-level interconnection structure in a third example of the invention. In this example, an Al alloy contains Sc as an impurity and is referred to as an Al-Sc alloy. An interlayer insulating film 2 in which a contact hole 3 is provided in formed on a silicon substrate 1. On the interlayer insulating film 2, Al-Sc alloy interconnections 18 and 19 are formed an a first interconnection. The Al-Sc alloy interconnection 19 fills the connecting hole 3 so as to be connected to the silicon substrate 1. On the Al-Sc alloy interconnections 18 and 19 and the interlayer insulating film 2, an interlayer insulating film 5 in which a via hole 6 is provided is formed. On the interlayer insulating film 5, Al-Sc alloy interconnections 20 and 21 are formed as a second interconnection. The Al-Sc alloy interconnection 20 fills the via hole 6 so an to be connected to the Al-SC alloy interconnection 18. The layered structure is covered with a passivation film 9.

Figure 15:
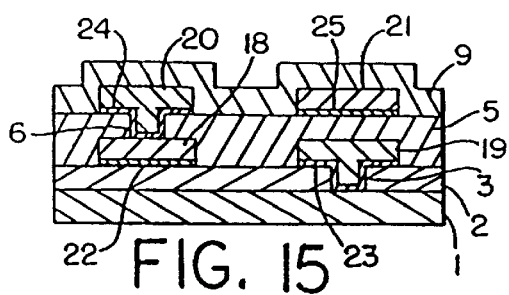
FIG. 15 is a sectional view showing a multi-level interconnection structure in another example of the invention.
Figure 16A:
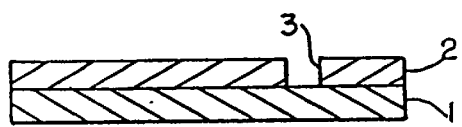
FIGS. 16A to 16E are sectional views showing a fabrication process of a multi-level interconnection structure in the other example of the invention.
Figure 16B:
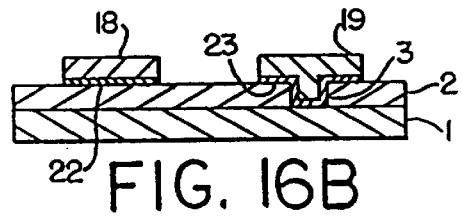
Figure 16C:
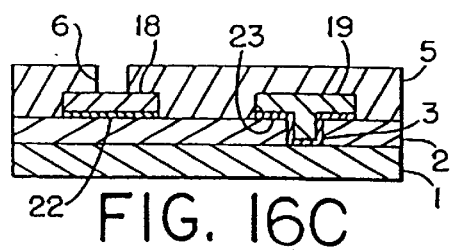
Figure 16D:
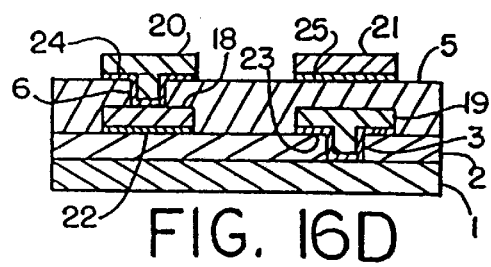
Figure 16E:
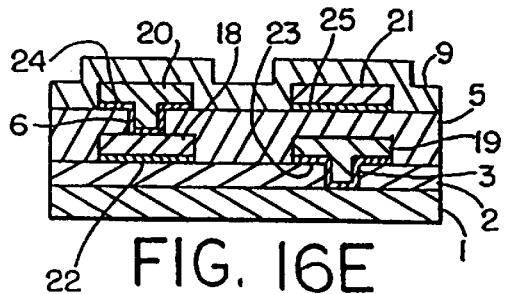

The Al-Sc alloy interconnections 18, 19, 20 and 21 may additionally contain Si, Cu, Ti, Ge, Hf, B or the like. As shown in FIG. 15, another layered structure may be used in which conductive film 22, 23, 24, and 25 of Ti, TiN, TiW, W, $TiSi_2$, $WSi_2$, Mo, $MoSi_2$ or the like are formed under the Al-Sc alloy interconnections 18, 19, 20 and 21, respectively, in this layered structure, by forming the conductive films under the Al-Sc-alloy films, the resistance against an electromigration or stressmigration can be enhanced as compared with a case of a single Al-Sc alloy film.

In this example, a two-level interconnection structure is described, but a multi-level interconnection structure having three or more level interconnections can attain the same effects.

Figure 14A:
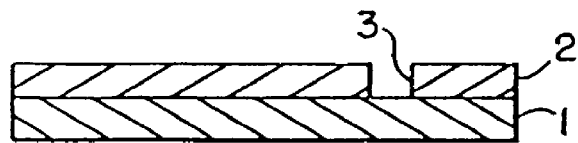
FIGS. 14A to 14E are sectional views showing a fabrication process of a multi-level interconnection structure in the third example of the invention.
Figure 14B:
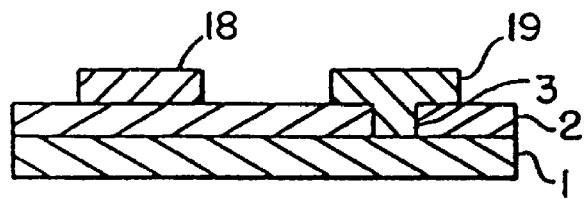
Figure 14C:
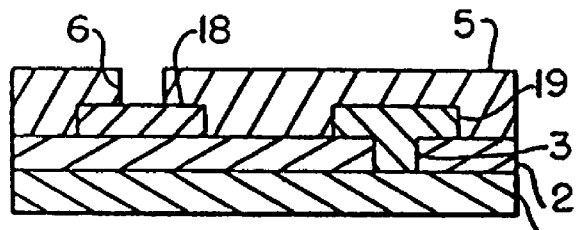
Figure 14D:
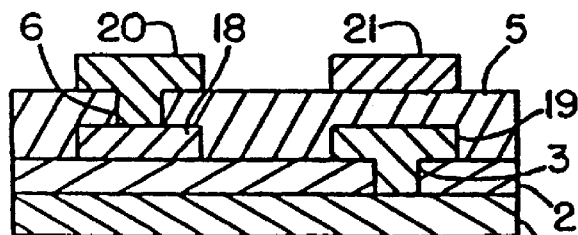
Figure 14E:
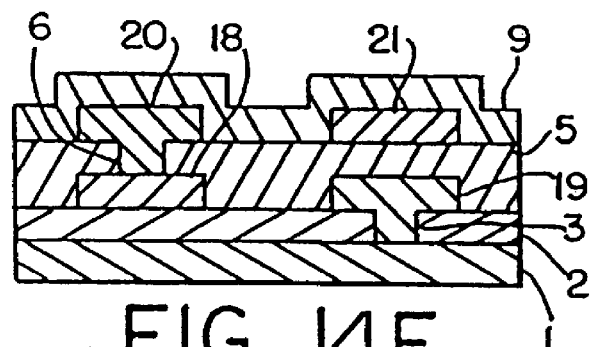

FIGS. 14A to 14E show a fabrication method of a multi-level interconnection structure in the third example of the invention. In FIG. 14E, the interlayer insulating film 2 in formed on the silicon substrate 1 on which semiconductor transistors are formed, and then annealed at 900° C. Then, the contact hole 3 is formed by photolithography and dry etching. As the interlayer insulating film 2, a silicon oxide film containing B and P is used and typically formed by CVD.

As shown in FIG. 14B, the Al-Sc alloy interconnections 18 and 19 are formed on the interlayer insulating film 2 in the following manner. First, an Al-SC alloy film is deposited by sputtering with a substrate temperature between 300° C. and 550° C. Then, the Al-Sc alloy film is patterned into the Al-Sc alloy interconnections 18 and 19 by photolithography and dry etching. In this case, since the Al-Sc alloy film in deposited at a high temperature, the Al-Sc alloy film is caused to flow in the deposition. As a result, the Al-Sc alloy interconnection 19 can completely fill the contact hole 3. The thickness of each of the Al-Sc alloy interconnections 18 and 19 is met to be 0.3 $\mu$m to 1.0 $\mu$m.

As shown in FIG. 14C, on the interlayer insulating film 2 and the Al-Sc alloy interconnections 18 and 19, the interlayer insulating film 5 is formed and planarized. An the interlayer insulating film 5, a silicon oxide film formed by plasma CVD in used. The planarization of the interlayer insulating film 5 in performed by etching back using a resist. Then, the via hole 6 in formed by photolithography and dry etching.

As shown in FIG. 14D, the bottom face of the via hole 6 is processed by Ar sputter etching in a sputtering apparatus. Thereafter, the Al-Sc alloy interconnections 20 and 21 are formed on the interlayer insulating film 5 in the following manner. First, an Al-Sc alloy film is deposited by sputtering with a substrate temperature between 300° C. and 550° C. Then, the Al-Sc alloy film in patterned into the Al-Sc alloy interconnections 20 and 21 by photolithography and dry etching. In this case, since the Al-Sc alloy film is deposited at a high temperature, the Al-Sc alloy film is caused to flow in the deposition. As a result, the Al-Sc alloy interconnection 20 can completely fill the connecting hole 6. The thickness of each of the Al-Sc alloy interconnections 20 and 21 is set to be 0.3 $\mu$m to 1.5 $\mu$m.

In a final step, an shown in FIG. 14E, the passivation film 9 having a layered structure including a silicon oxide film containing P and a silicon nitride film is formed on the entire surface.

In this example, as shown in FIGS. 16A to 16E, prior to the formation of the Al-Sc alloy interconnections 18 and 10, and 20 and 21, the conductive films 22 and 23, 24 and 25 of Ti, TiN, TiW, W, $TiSi_2$, $WSi_2$, Mo, $MoSi_2$ or the like may be formed, respectively. In this case, by reacting the Al-Sc alloy films with the conductive films, the wetting of the Al-Sc alloy films to the side wells of the contact holes is improved. As a result, the filling of the contact holes can be easily performed.

EXAMPLE 4

Figure 17:
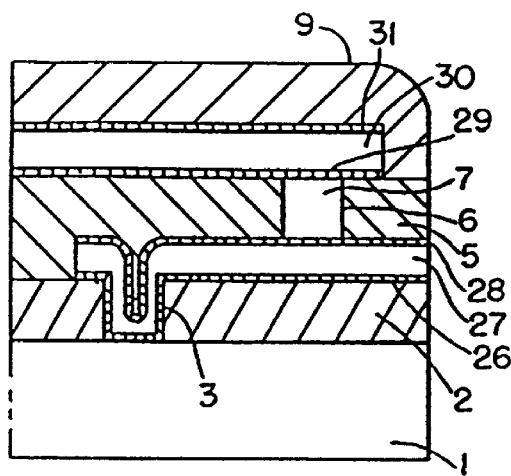
FIG. 17 is a sectional and schematic view showing an Al interconnection structure in a semiconductor device in a fourth example of the invention.

FIG. 17 is a sectional and schematic view showing an Al interconnection structure in a semiconductor device in a fourth example of the invention. An insulating film 2 is formed over a silicon substrate 1 and a contact hole 3 is selectively formed in the insulating film 2. A thin Sc film 26 is deposited to a thickness of 50 nm through the contact hole 3. Then, a layered first Al interconnection including a thin Al-1%Si-0.5%Cu alloy film 27 having a thickness of 400 nm and a thin Sc film 28 having a thickness of 10 nm is coupled to the silicon substrate 1. The layered first Al interconnection is connected to a layered second Al interconnection through a tungsten plug 7 buried in a via hole 6 which is formed in an interlayer insulating film 5. The layered second Al interconnection includes a thin Sc film 29 having a thickness of 50 nm, a thin Al-1%Si-0.5%Cu alloy film 30 having a thickness of 800 nm, and a thin Sc film 31 having a thickness of 10 nm. The layered structure is covered with a passivation film 9 such as a silicon nitride film or a silicon oxide film. One of the features of the invention resides in that the layered first and second Al interconnections have the thin Sc films 26 and 28, 29 and 31 on and under the thin Al alloy films 27 and 30, respectively.

Figure 18B:
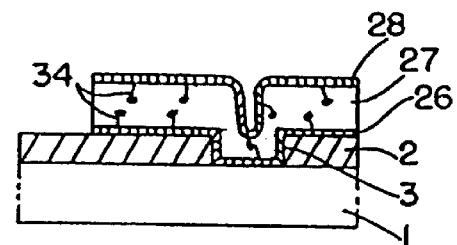
FIGS. 18A to 18C are sectional views showing a fabricating process of the Al interconnection structure in a semiconductor device in the fourth example of the invention.
Figure 18A:
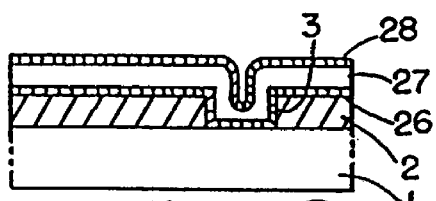
Figure 18C:
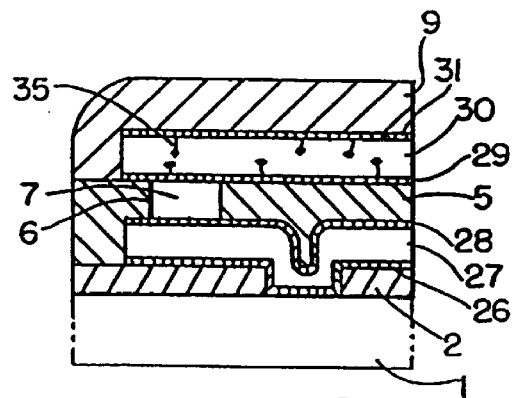
Figure 19:
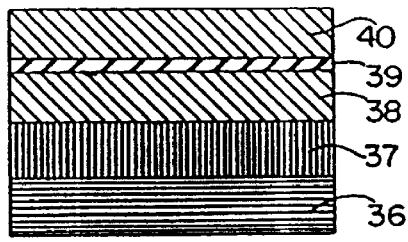
FIG. 19 is a sectional and schematic view showing an Al interconnection structure in a semiconductor device of a prior art.

FIGS. 18A to 18C are sectional views showing a fabrication process of the Al interconnection in a semiconductor device in the fourth example of the invention.

As shown in FIG. 18A, the interlayer insulating film 2 is formed over the silicon substrate 1 on which semiconductor transistors are formed. The contact hole 3 is selectively formed. Then, the thin Sc film 26 having a thickness of 50 nm, the thin Al-1%Si-0.5%Cu alloy film 27 having a thickness of 400 nm, and the thin Sc film 28 having a thickness of 10 nm are deposited by sputtering.

As shown in FIG. 18B, the thin Sc film 26, the Al-1%Si-0.5%Cu alloy film 27 and the thin Sc film 28 are patterned into the layered first Al interconnection by photoetching. Thereafter, an annealing is performed at 350° C. to 600° C., so that Sc is diffused into the thin Al-1%Si-0.5Cu alloy film 27.

As shown in FIG. 18C, the interlayer insulating film 5 is formed, and the via hole 6 is formed by photoetching. The tungsten plug 7 to buried in the via hole 6. Then the thin Sc film 29 having a thickness of 50 nm, the thin Al-1%Si-0.5%Cu alloy film 30 having a thickness of 800 nm, and the thin Sc film 31 having a thickness of 10 nm are deposited by sputtering. The thin Sc film 29, the thin Al-1%Si-0.5Cu alloy film 30, and the thin Sc film 31 are patterned into the layered second Al interconnection by photoetching. Thereafter, an annealing is performed at 350° C. to 600° C., so that Sc is diffused into the thin Al-1%Si-0.5%Cu alloy film 30. The layered structure is covered with the passivation film 8 such as a silicon nitride film or a silicon oxide film.

As described above, in this example, the Al interconnection has a structure in which an Al alloy and Sc are layered. After the Al alloy interconnection is formed, an annealing is performed, so that Sc is diffused into the Al alloy interconnection to form an Al interconnection containing Sc as an impurity. An a result, the hardness of the Al alloy interconnection is improved. Therefore, it is possible to produce an Al interconnection having a high resistance against a stressmigration or electromigration even when a current stress in applied at a practical temperature in an LSI.

In the above example, an Al-1%Si-0.5Cu alloy is used as the Al alloy, but another Al alloy such as Al-Si, Al-Sc or Al-Pd can attain the some effect. In the above example, the upper and lower thin Sc films respectively have thicknesses of 50 nm and 10 nm. Alternatively, the thickness may be 1 nm to 200 nm, and one of the upper and lower films may be a thin SC film, which can attain the same effects. The Al alloy and Sc layers can be deposited by sputtering or by CVD.

In this example, the tungsten plug 7 is used, as shown in FIGS. 17 and 18C. It is understood that the some effects can be attained in an alternative case where the contact hole and the via hole are filled by an Al high temperature sputtering method in which a substrate temperature is hold at 300° C. to 600° C.

As described above, according to the invention, as a material for an Al interconnection, an Al-Sc alloy containing Sc is used, so that the hardness of the interconnection is improved. Moreover, after a thin Al-Sc alloy film is formed, an annealing is performed so as to make a crystal grain larger than the width of the interconnection. As a result, the resulting Al interconnection can have a high resistance against a stressmigration or electromigration, when a current stress in applied at a practical temperature in an LSI. This greatly contributes to the fabrication of a very fine semiconductor device.

Various other modifications will be apparent to and can be readily made by those skilled in the art without departing from the scope end spirit of this invention. Accordingly, it is not intended that the scope of the claims appended hereto be limited to the description as set forth herein, but rather that the claims be broadly construed.

What is claimed is:

1. A fine, miniaturized, aluminum interconnection made from a thin film deposited over an insulating surface, the interconnection comprising a crystalline aluminum film containing scandium as an impurity and connecting a plurality of semiconductor devices that are integrated on a substrate, wherein the crystalline aluminum film includes a crystal grain which is sufficiently large to provide increased migration resistance to said interconnection.

2. An aluminum interconnection according to claim 1, wherein said scandium is substantially uniformly distributed.

3. An aluminum interconnection according to claim 2, wherein part of said scandium is distributed as a precipitate.

4. An aluminum interconnection according to claim 3, wherein a lattice constant of said precipitate is in the range of 100% to 103% with respect to the lattice constant of aluminum.

5. An aluminum interconnection according to claim 1, wherein the amount of said scandium is in the range of 0.01 wt. % to 0.5 wt. %.

6. A fine, miniaturized, interconnection made from a thin film deposited over an insulating surface, the interconnection comprising an aluminum layer and a conductive layer formed on at least one of the upper and lower sides of said aluminum layer and connecting a plurality of semiconductor devices that are integrated on a substrate, wherein said aluminum layer contains scandium as an impurity and said aluminum layer includes a crystal grain which is sufficiently large to provide increased migration resistance to said interconnection.

7. An interconnection according to claim 6, wherein said conductive layer is made of a refractory metal material.

8. A semiconductor device comprising:

a semiconductor substrate;

an insulating film formed on said semiconductor substrate;

an opening formed in said insulating film; and a fine, miniaturized, interconnection made from a thin film deposited over said insulating film, said interconnection being in contact with said semiconductor substrate via said opening and connecting a plurality of semiconductor devices that are integrated on a substrate, wherein said interconnection includes an aluminum layer containing scandium as an impurity and said aluminum layer includes a crystal grain which is sufficiently large to provide increased migration resistance to said interconnection.

9. A semiconductor device according to claim 8, wherein said interconnection further includes a conductive layer at least between sold aluminum layer and said semiconductor substrate.

10. A semiconductor device comprising:

a first interconnection;

an interlayer insulating film which covers said first interconnection;

an opening formed in said interlayer insulating film; and a fine, miniaturized, second interconnection made from a thin film deposited over said interlayer insulating film, said second interconnection being in contact with said first interconnection via said opening and connecting a plurality of semiconductor devices that are integrated on a substrate, wherein said second interconnection includes an aluminum layer containing scandium as an impurity and said aluminum layer includes a crystal grain which is sufficiently large to provide increased migration resistance to said second interconnection.

11. A semiconductor device according to claim 10, wherein said second interconnection further includes a conductive layer at least between said aluminum and said first interconnection.

12. A fine, miniaturized, interconnection made from a thin film deposited over an insulating surface, the interconnection comprising an aluminum layer and a conductive layer formed on at least one of the upper and lower sides of said aluminum layer and connecting a plurality of semiconductor devices that are integrated on a substrate, wherein said conductive layer contains scandium as an impurity and said aluminum layer includes scandium as an impurity diffused from said conductive layer, said aluminum layer including a crystal grain which is sufficiently large to provide increased migration resistance to said interconnection.

13. An interconnection according to claim 12, wherein said conductive layer is made of scandium.

14. An aluminum interconnection according to claim 2, wherein the amount of said scandium is in the range of 0.01 wt. % to 0.5 wt. %.

15. An aluminum interconnection according to claim 3, wherein the amount of said scandium is in the range of 0.01 wt. % to 0.5 wt. %.

16. An aluminum interconnection according to claim 4, wherein the amount of said scandium is in the range of 0.01 wt. % to 0.5 wt. %.

17. The aluminum interconnection of claim 1 having a thickness in the range of 100 to 1500 nm and a scandium content of 0.01% to 0.5% by weight.

18. A fine, miniaturized, aluminum interconnection according to claim 1, wherein said crystal grain included in said crystalline aluminum film is larger than a width of said interconnection.

19. A fine, miniaturized, aluminum interconnection according to claim 1, wherein a diameter of said crystal grain included in said crystalline aluminum film is in a range of about 1 $\mu$m to about 2 $\mu$m.

20. A fine, miniaturized, aluminum interconnection according to claim 1, wherein said crystalline aluminum film has a bamboo structure.

21. A fine, miniaturized, interconnection according to claim 6, wherein said crystal grain included in said aluminum layer is larger than a width of said interconnection.

22. A fine, miniaturized, interconnection according to claim 6, wherein a diameter of said crystal grain included in said aluminum layer is in a range of about 1 $\mu$m to about 2 $\mu$m.

23. A fine, miniaturized, interconnection according to claim 6, wherein said aluminum layer has a bamboo structure.

24. A semiconductor device according to claim 8, wherein said crystal grain included in said aluminum layer is larger than a width of said interconnection.

25. A semiconductor device according to claim 8, wherein a diameter of said crystal grain included in said aluminum layer is in a range of about 1 $\mu$m to about 2 $\mu$m.

26. A semiconductor device according to claim 8, wherein said aluminum layer has a bamboo structure.

27. A semiconductor device according to claim 10, wherein said crystal grain included in said aluminum layer is larger than a width of said second interconnection.

28. A semiconductor device according to claim 10, wherein a diameter of said crystal grain included in said aluminum layer is in a range of about 1 $\mu$m to about 2 $\mu$m.

29. A semiconductor device according to claim 10, wherein said aluminum layer has a bamboo structure.

30. A fine, miniaturized, interconnection according to claim 12, wherein said crystal grain included in said aluminum layer is larger than a width of said interconnection.

31. A fine, miniaturized, interconnection according to claim 12, wherein a diameter of said crystal grain included in said aluminum layer is in a range of about 1 $\mu$m to about 2 $\mu$m.

32. A fine, miniaturized, interconnection according to claim 12, wherein said aluminum layer has a bamboo structure.

* * * * *

UNITED STATES PATENT AND TRADEMARK OFFICE
CERTIFICATE OF CORRECTION

PATENT NO. : 5,804,879

DATED : Sep. 8, 1998

INVENTOR(S) : Ogawa et al.

It is certified that error appears in the above-identified patent and that said Letters Patent is hereby corrected as shown below:

In The Abstract:

Line 4, please change "80" to read --so--.
Line 8, please change "in applied" to read --is applied--.

Column 1, line 25, please change "An" to read --As--.
Column 1, line 28, please change "in selectively" to read --is selectively--.
Column 1, line 31, please change "in deposited" to read --is deposited--.
Column 1, line 33, please change "in formed" to read --is formed--.
Column 1, line 43, please change "in annealed" to read --is annealed--.
Column 1, line 49, please change "in enhanced" to read --is enhanced--.
Column 2, line 17, please change "tho movement" to read --the movement--.
Column 2, line 39, please change "some time" to read --same time--.
Column 4, line 17, please change "Sc in" to read --Sc is--.
Column 4, line 18, please change "an a compound" to read --as a compound--.
Column 4, line 19, please change "Sc in" to read --Sc is--.
Column 4, line 52, please change "in" to read --is--.
Column 6, line 7, please change "layers" to read --layered--.
Column 6, line 19, please change "sat" to read --set--.
Column 6, line 19, please change "in that" to read --is that--.
Column 6, line 19, please change "Sc in" to read --Sc is--.
Column 6, line 49, please change "in formed" to read --is formed--.
Column 6, line 56, please change "alloy is which" to read --alloy which--.
Column 6, line 58, please change film in" to read --film is--.

UNITED STATES PATENT AND TRADEMARK OFFICE
CERTIFICATE OF CORRECTION

PATENT NO.    : 5,804,879

DATED         : Sep. 8, 1998

INVENTOR(S)   : Ogawa et al.

It is certified that error appears in the above-identified patent and that said Letters Patent is hereby corrected as shown below:

Column 6, line 64, please change "Al-SC" to read --Al-Sc--
Column 7, line 5, please change "in about" to read --is about--.
Column 7, line 6, please change "in formed" to read --is formed--.
Column 7, line 16, please change "then " to read --than--.
Column 7, line 51, please change "an a" to read --as a --.
Column 7, line 57, please change "FIG. 20D" to read --FIG. 20B--.
Column 7, line 57, please change "it in" to read --it is--.
Column 8, line 6, please change "an compared" to read --as compared--.
Column 8, line 11, please change "same an" to read --same as--.
Column 8, line 12, please change "tho" to read --the--.
Column 8, line 16, please change "Au" to read --As--.
Column 8, line 21, please change "$Al_3SO$" to read --$Al_3Sc$--.
Column 8, line 36, please change "density in" to read --density is--.
Column 9, line 12, please change "It" to read --If--.
Column 9, line 67, please change "burled" to read --buried--.
Column 10, line 8, please change "in covered" to read --is covered--.
Column 10, line 37, please change "An a result" to read --As a result--.
Column 10, line 67, please change "in formed" to read --is formed--.
Column 11, line 2, please change "an a first" to read --as a first--.
Column 11, line 18, please change "respectively," to read --respectively.--.
Column 11, line 19, please change "in this" to read --In this--.
Column 11, line 39, please change "Al-SC" to read --Al-Sc--.
Column 11, line 43, please change "in" to read --is--.
Column 11, line 51, please change "An" to read --As--.
Column 11, line 52, please change "in used" to read --is used--.

UNITED STATES PATENT AND TRADEMARK OFFICE
CERTIFICATE OF CORRECTION

PATENT NO. : 5,804,879

DATED : Sep. 8, 1998

INVENTOR(S) : Ogawa et al.

It is certified that error appears in the above-identified patent and that said Letters Patent is hereby corrected as shown below:

Column 11, line 54, please change "in performed" to read --is performed--.
Column 11, line 55, please change "in formed" to read --is formed--.
Column 12, line 9, please change "18 and 10" to read --18 and 19--.
Column 12, line 60, please change "to buried" to read --is buried--.
Column 13, line 9, please change "An a result" to read --As a result--.
Column 13, line 20, please change "SC film" to read --Sc film--.
Column 13, line 38, please change "in applied" to read --is applied--.

In The Claims:

Claim 9, line 3, please change "sold" to read --said--.

Signed and Sealed this

Twenty-fifth Day of May, 1999

*Attest:*

*Attesting Officer*

Q. TODD DICKINSON

*Acting Commissioner of Patents and Trademarks*